(12) United States Patent
Yang et al.

(10) Patent No.: US 10,854,434 B2
(45) Date of Patent: Dec. 1, 2020

(54) MAGNETRON, MAGNETRON SPUTTERING CHAMBER, AND MAGNETRON SPUTTERING APPARATUS

(71) Applicant: BEIJING NAURA MICROELECTRONICS EQUIPMENT CO., LTD., Beijing (CN)

(72) Inventors: Yujie Yang, Beijing (CN); Tongwen Zhang, Beijing (CN)

(73) Assignee: BEIJING NAURA MICROELECTRONICS EQUIPMENT CO., LTD., Beijing (CN)

(*) Notice: Subject to any disclaimer, the term of this patent is extended or adjusted under 35 U.S.C. 154(b) by 0 days.

(21) Appl. No.: 16/387,996

(22) Filed: Apr. 18, 2019

(65) Prior Publication Data

US 2019/0244796 A1    Aug. 8, 2019

Related U.S. Application Data

(63) Continuation of application No. PCT/CN2017/107831, filed on Oct. 26, 2017.

(30) Foreign Application Priority Data

Oct. 31, 2016    (CN) .......................... 2016 1 0930978

(51) Int. Cl.
*H01J 37/34*    (2006.01)
*C23C 14/35*    (2006.01)
*H01J 25/50*    (2006.01)

(52) U.S. Cl.
CPC .......... *H01J 37/3405* (2013.01); *C23C 14/35* (2013.01); *H01J 25/50* (2013.01);
(Continued)

(58) Field of Classification Search
CPC ............... H01J 37/3405; H01J 37/3452; H01J 37/3455; H01J 37/34; H01J 25/50; H01J 2237/332; C23C 14/35
(Continued)

(56) References Cited

U.S. PATENT DOCUMENTS

| | | | | | |
|---|---|---|---|---|---|
| 5,242,566 | A | * | 9/1993 | Parker .................. | H01J 37/3408 204/192.12 |
| 7,186,319 | B2 | * | 3/2007 | Yang .................... | H01J 37/3405 204/192.12 |

(Continued)

FOREIGN PATENT DOCUMENTS

| CN | 1997768 A | 7/2007 |
|---|---|---|
| CN | 102789941 A | 11/2012 |
| CN | 104937134 A | 9/2015 |

OTHER PUBLICATIONS

The World Intellectual Property Organization (WIPO) International Search Report for PCT/CN2017/107831 dated Feb. 5, 2018 6 Pages (including translation).

*Primary Examiner* — Rodney G McDonald
(74) *Attorney, Agent, or Firm* — Anova Law Group, PLLC

(57) ABSTRACT

Magnetron, magnetron sputtering chamber, and magnetron sputtering apparatus are provided. The magnetron has a rotation center, and includes a first outer magnetic pole and a first inner magnetic pole of opposite polarities. The first outer magnetic pole has an annular structure around the rotation center. The first inner magnetic pole is located on the inner side of the first outer magnetic pole, and a first magnetic field track is formed between the first inner magnetic pole and the first outer magnetic pole. A straight line starting from the rotation center and along one of the radial directions passes through the first magnetic field track at least twice in succession, and the magnetic-field directions (Continued)

US 10,854,434 B2

Page 2 at the two positions of the first magnetic field track that the straight line passes through twice in succession are opposite to each other.

20 Claims, 13 Drawing Sheets

(52) U.S. Cl.
CPC .......... *H01J 37/34* (2013.01); *H01J 37/3452* (2013.01); *H01J 2237/332* (2013.01)

(58) Field of Classification Search
USPC .............................. 204/298.19, 298.2, 192.2
See application file for complete search history.

(56) References Cited

U.S. PATENT DOCUMENTS

| | | | |
|---|---|---|---|
| 2003/0146084 A1* | 8/2003 | Fu | ........................... C23C 14/14 204/192.2 |
| 2003/0201174 A1 | 10/2003 | Cord et al. | |
| 2007/0108041 A1* | 5/2007 | Guo | .................... H01J 37/3408 204/192.1 |

* cited by examiner

MAGNETRON, MAGNETRON SPUTTERING CHAMBER, AND MAGNETRON SPUTTERING APPARATUS

CROSS-REFERENCE TO RELATED APPLICATIONS

This application is a continuation of International Application No. PCT/CN2017/107831, filed on Oct. 26, 2017, which claims the priority and benefits of Chinese Patent Application Serial No. CN201610930978.7, filed with the State Intellectual Property Office of P. R. China on Oct. 31, 2016, the entire content of all of which is incorporated herein by reference.

FIELD OF THE INVENTION

The present invention relates to the field of microelectronics and, more particularly, relates to a magnetron, a magnetron sputtering chamber, and a magnetron sputtering apparatus.

BACKGROUND

With the development of technology, the integrated circuit manufacturing process has been able to significantly reduce the size of the processor. However, there are still some core components such as integrated inductors, noise suppressors, etc., facing many difficulties in high frequency, miniaturization, integration, etc. In order to solve this problem, soft magnetic thin film materials with high magnetization, high magnetic permeability, high resonance frequency, and high electrical resistivity have attracted more and more attention.

Although the focus on soft magnetic thin film material is mainly on high magnetic permeability and high magnetization, as well as low coercivity and low loss, a major factor that affects the development of soft magnetic thin film material is its cutoff frequency. By adjusting the in-plane uniaxial anisotropy field of the soft magnetic thin film, the cutoff frequency of the soft magnetic thin film material can be adjusted. Moreover, a common method for controlling the in-plane uniaxial anisotropy field of a soft magnetic thin film is magnetic-field-induced deposition, which has the advantages for providing simple process without adding process steps, and less damage to the chip, and is a preferred method for industrial production.

In addition, in order to improve the efficiency of sputtering and the utilization of the target, it is necessary to provide a magnetron on the back of the target. By using the magnetic field generated by the magnetron, the trajectory of the electrons may be extended to increase the probability of the electrons colliding with the process gas. As such, the density of the plasma may be increased, thereby improving the efficiency of sputtering and the utilization of the target.

However, when using an existing magnetron to make soft magnetic thin films, the uniformity of the thin films formed by sputtering may still be undesired. The disclosed magnetron, magnetron sputtering chamber, and magnetron sputtering apparatus are directed to solve one or more problems set forth above and other problems in the art.

BRIEF SUMMARY OF THE INVENTION

One aspect of the present disclosure provides a magnetron. The magnetron has a rotation center, and includes a first outer magnetic pole and a first inner magnetic pole of opposite polarities. The first outer magnetic pole has an annular structure around the rotation center. The first inner magnetic pole is located on the inner side of the first outer magnetic pole, and a first magnetic field track is formed between the first inner magnetic pole and the first outer magnetic pole. A straight line starting from the rotation center and along one of the radial directions passes through the first magnetic field track at least twice in succession, and the magnetic-field directions at the two positions of the first magnetic field track that the straight line passes through twice in succession are opposite to each other.

Another aspect of the present disclosure provides a magnetron sputtering chamber, configured to deposit magnetic thin films. The magnetron sputtering chamber includes a magnetron. The magnetron has a rotation center and includes a first outer magnetic pole and a first inner magnetic pole of opposite polarities. The first inner magnetic pole is located on the inner side of the first outer magnetic pole, and a first magnetic field track is formed between the first inner magnetic pole and the first outer magnetic pole. A straight line starting from the rotation center and along one of the radial directions passes through the first magnetic field track at least twice in succession, and the magnetic-field directions at the two positions of the first magnetic field track that the straight line passes through twice in succession are opposite to each other. The magnetron rotates around the rotation center to scan the surface of the target, and a bias magnetic field device for forming a horizontal magnetic field is disposed in the magnetron sputtering chamber.

Another aspect of the present disclosure provides a magnetron sputtering apparatus including a magnetron sputtering chamber according to the present disclosure.

Other aspects of the present disclosure can be understood by those skilled in the art in light of the description, the claims, and the drawings of the present disclosure.

DETAILED DESCRIPTION

To better understand the technical solutions of the present disclosure, the magnetron, the magnetron sputtering chamber, and the magnetron sputtering apparatus provided by the present disclosure will be described in detail below with reference to the accompanying drawings.

Figure 1A:
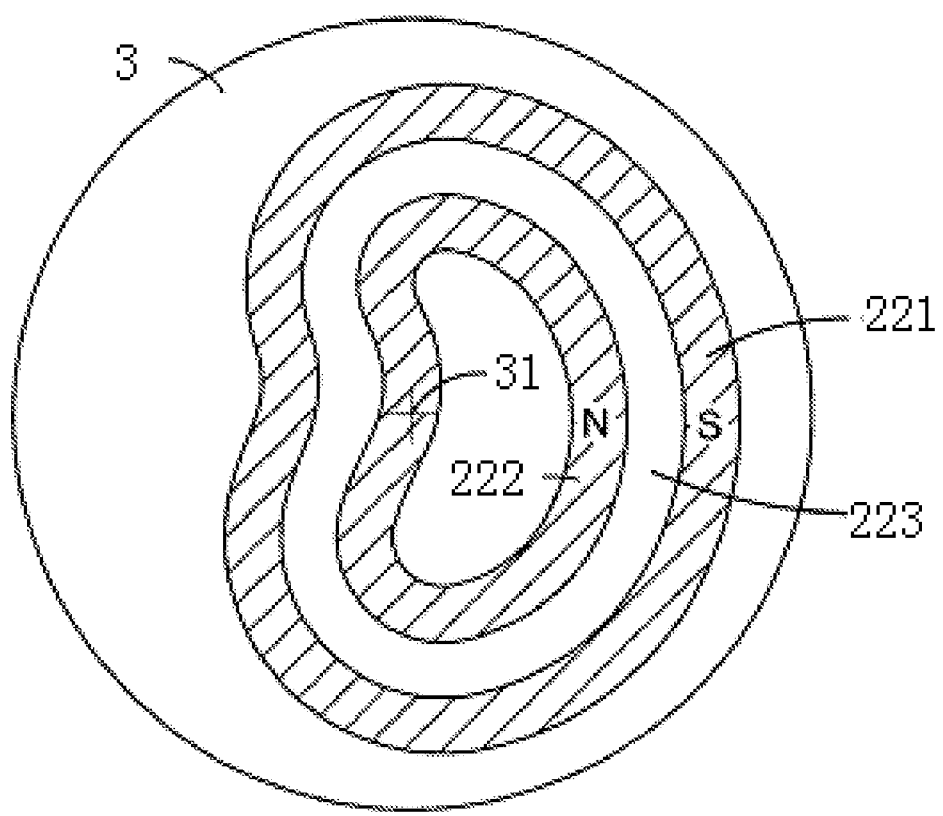
FIG. 1A illustrates a schematic view of a first structure of a magnetron.
Figure 1B:
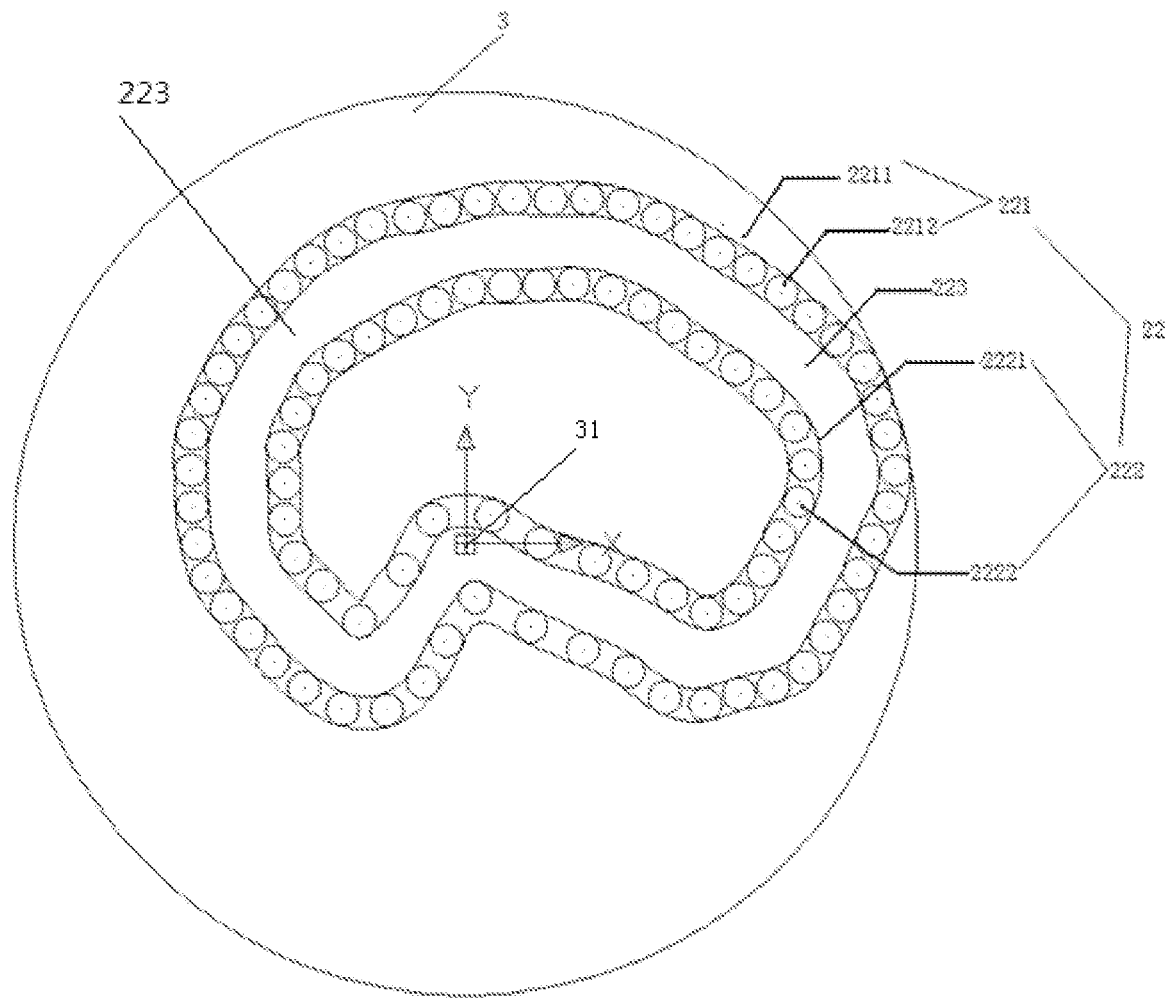
FIG. 1B illustrates a schematic view of a second structure of a magnetron.

FIG. 1A illustrates a schematic view of a first structure of a magnetron, and FIG. 1B illustrates a schematic view of a second structure of a magnetron.

Referring to FIG. 1A and FIG. 1B, the magnetron may be used to deposit magnetic thin films in a magnetron sputtering chamber. In particular, FIG. 1A illustrates a symmetrical kidney-shaped magnetron, which rotates around a rotation center 31 to scan the surface of the target 3. The symmetrical kidney-shaped magnetron includes an outer magnetic pole 221 and an inner magnetic pole 222. The shapes of the orthographic projections of the two on the target 3 are both closed-ring shapes, and the polarities are opposite to each other. In addition, a magnetic field track 223 is formed between the outer magnetic pole 221 and the inner magnetic pole 222.

Similar to the magnetron shown in FIG. 1A, an asymmetric kidney-shaped magnetron is shown in FIG. 1B. The outer magnetic pole 221 and the inner magnetic pole 222 of the magnetron are asymmetric in shape. In addition, the outer magnetic pole 221 includes an outer magnetic yoke 2211 and a plurality of outer magnets 2212 disposed on the outer magnetic yoke 2211; the inner magnetic pole 222 includes an inner magnetic yoke 2221 and a plurality of inner magnets 2222 disposed on the inner magnetic yoke 2221.

When using the two types of magnetrons similar to those shown in FIG. 1A and FIG. 1B, there is a problem that when a soft magnetic thin film is formed by a magnetron sputtering apparatus that adopts a bias magnetic field, the uniformity of the sputtered film is poor. Its uniformity is generally greater than 20% (calculated as the standard deviation of the thin film thickness or the average value of the thin film thickness). Because the process requires the uniformity of the magnetic thin film to be smaller than or equal to 5%, the use of the two types of magnetrons shown in FIGS. 1A and 1B does not satisfy the needs for the uniformity of magnetic thin films.

Figure 2:
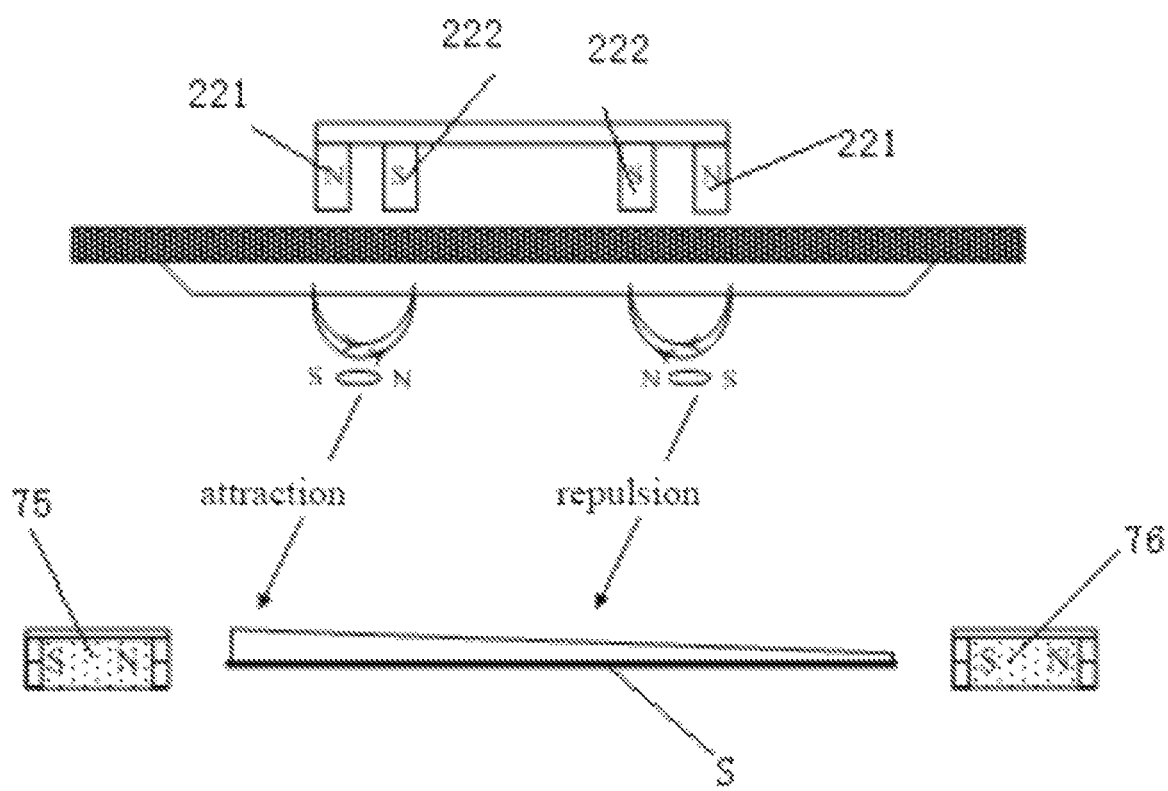
FIG. 2 illustrates a schematic diagram of the working principle of the magnetrons shown in FIG. 1A and FIG. 1B.

The reason why the uniformity of the thin films formed by using the above two types of magnetrons is poor will be described in detail below. Specifically, as shown in FIG. 2, the bias magnetic field is generated by a first magnetic cylinder 75 and a second magnetic cylinder 76 disposed on the two sides of the workpiece S to be processed. The N pole of the first magnetic cylinder 75 may point to the workpiece S to be processed, and the S pole of the second magnetic cylinder 76 may point to the workpiece S to be processed. On the basis of this, the magnetic domain direction of the sputtered magnetic materials that correspond to the portion of the magnetic field track 223 located between the outer magnetic pole 221 and the inner magnetic pole 222 and corresponding to the left-side region of the workpiece S to be processed (the region close to the first magnetic cylinder 75) may be opposite to the magnetic pole direction of the first magnetic cylinder 75. The magnetic domain direction of the sputtered magnetic materials that correspond to the portion of the magnetic field track 223 corresponding to the right-side region of the workpiece S to be processed (the region close to the second magnetic cylinder 76) may be the same as the magnetic pole direction of the second magnetic cylinder 76. Therefore, the magnetic material sputtered from the target and corresponding to the left-side region of the workpiece S to be processed may be attracted to the left by the attraction of the first magnetic cylinder 75, and the magnetic material corresponding to the right-side region of the workpiece S to be processed may be repulsed by the second magnetic cylinder 76 and thus shift to the left as well. As a result, the magnetic thin film formed by the deposition gradually thickens from right to left, resulting in poor uniformity of the thin film, which cannot meet the requirement for the uniformity of the magnetic thin film.

Figure 3:
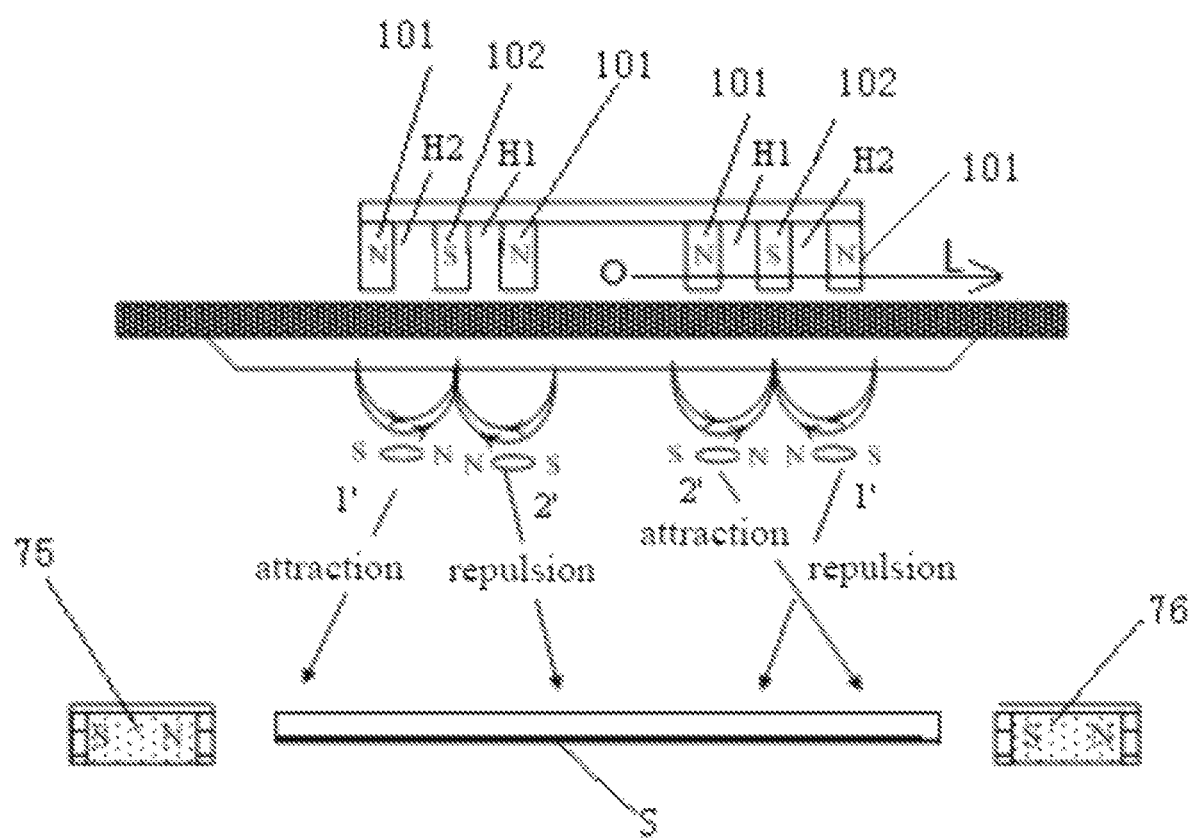
FIG. 3 illustrates a schematic diagram of the working principle of a magnetron provided by the embodiments of the present disclosure.

The present disclosure provides a magnetron to improve the uniformity of the thin films deposited using the magnetron. FIG. 3 illustrates a schematic diagram of the working principle of a magnetron provided by the embodiments of the present disclosure. Referring to FIG. 3, the magnetron may have a rotation center O, and may include a first outer magnetic pole 101 and a first inner magnetic pole 102 of opposite polarities. The outer magnetic pole 101 may have an annular structure around the rotation center O; the first inner magnetic pole 102 may be located on the inner side of the first outer magnetic pole 101, and a first magnetic field track may be formed between the first inner magnetic pole 102 and the first outer magnetic pole 101. A straight line L starting from the rotation center O and along one of the radial directions may pass through the first magnetic field track twice in succession, and the magnetic-field directions at the two positions of the first magnetic field track that the straight line L passes through twice in succession may be opposite to each other.

That is, the first outer magnetic pole 101 and the first inner magnetic pole 102 may have a gap in between. Moreover, a straight line L starting from the rotation center O and along one of the radial directions may pass through the gap twice. The gap that is passed through for the first time may be H1, the gap that is passed through for the second time may be H2, and the magnetic-field direction at the gap H1 may be opposite to the magnetic-field direction at the gap H2.

When the magnetron provided by the embodiments of the present disclosure is used to fabricate a soft magnetic thin film in a magnetron sputtering apparatus that adopts a bias magnetic field, the magnetic materials sputtered from the target material and respectively corresponding to the gap H1 and the gap H2 may have different magnetic directions. Specifically, the direction of the magnetization of the magnetic material corresponding to the gap H1 is 1'; and the direction of the magnetization of the magnetic material corresponding to the gap H2 is 2'. In this case, the magnetic material on the left side that has a magnetization in the direction of 1' may be subjected to an attractive force of the first magnetic cylinder 75 and thus shift toward the edge of the workpiece S to be processed, and the magnetic material on the left side that has a magnetization in the direction of 2' may be subjected to a repulsive force of the first magnetic cylinder 75 and thus shift toward the center of the workpiece S to be processed; similarly, the magnetic material on the right side that has a magnetization in the direction of 1' may be subjected to a repulsive force of the second magnetic cylinder 76 and thus shift toward the center of the workpiece S to be processed; the magnetic material on the right side that has a magnetization in the direction of 2' may be subjected to an attractive force of the second magnetic cylinder 76 and thus shift toward the edge of the workpiece S to be processed. Therefore, the magnetron provided by the embodiments of the present disclosure can cooperate with the bias magnetic field to compensate for the difference in the amount of magnetic materials deposited to the edge region and the central region of the workpiece S to be processed, and thus improves the uniformity of the thin film. The uniformity of the magnetic thin film obtained by using the magnetron provided by the embodiments of the present disclosure may be smaller than or equal to 5%, thereby satisfying the industrial demand for the uniformity of the magnetic thin film.

In addition, the magnetron provided by the embodiments of the present disclosure can also produce films with desired uniformity when used for sputtering deposition of a non-magnetic thin film.

Moreover, when the magnetron provided by the embodiments of the present disclosure satisfies the following conditions, the sputtering uniformity of the entire surface of the workpiece to be processed can be achieved, and in particular, the sputtering uniformity of a magnetic thin film on a small-sized workpiece to be processed may be better. The conditions that should be satisfied may be: along the direction of a straight line L starting from the rotation center O and along one of the radial directions, the first outer magnetic pole 101 and the first inner magnetic pole 102 are alternately arranged and spaced apart by a certain distance (such as the gap H1 and the space H2 in FIG. 3); a first magnetic field track 103 is formed between the first outer magnetic pole 101 and the first inner magnetic pole 102; a straight line L starting from the rotation center O and along one of the radial directions passes through the first magnetic field track 103 twice in succession, and the magnetic-field directions at the two positions of the first magnetic field track that the straight line passes through twice in succession are opposite to each other.

When the magnetron provided by the embodiments of the present disclosure satisfies the above conditions only at the edge portion of the target, at least the uniformity of the magnetic thin film sputtered at the edge portion of the workpiece to be processed can be improved. Therefore, it can be applied to uniform sputtering of magnetic thin films of large size workpieces to be processed.

Optionally, the number of times that the straight line L passes through the first magnetic field track 103 may be an even number. As such, there may be at least two positions on the first magnetic field track 103 having opposite magnetic-field directions to ensure that magnetic material experiencing attraction and magnetic material experiencing repulsion appear in pairs. As such, the uniformity of the thin film may be further improved. The even number can be equal to 2 or greater than 2.

Figure 4A:
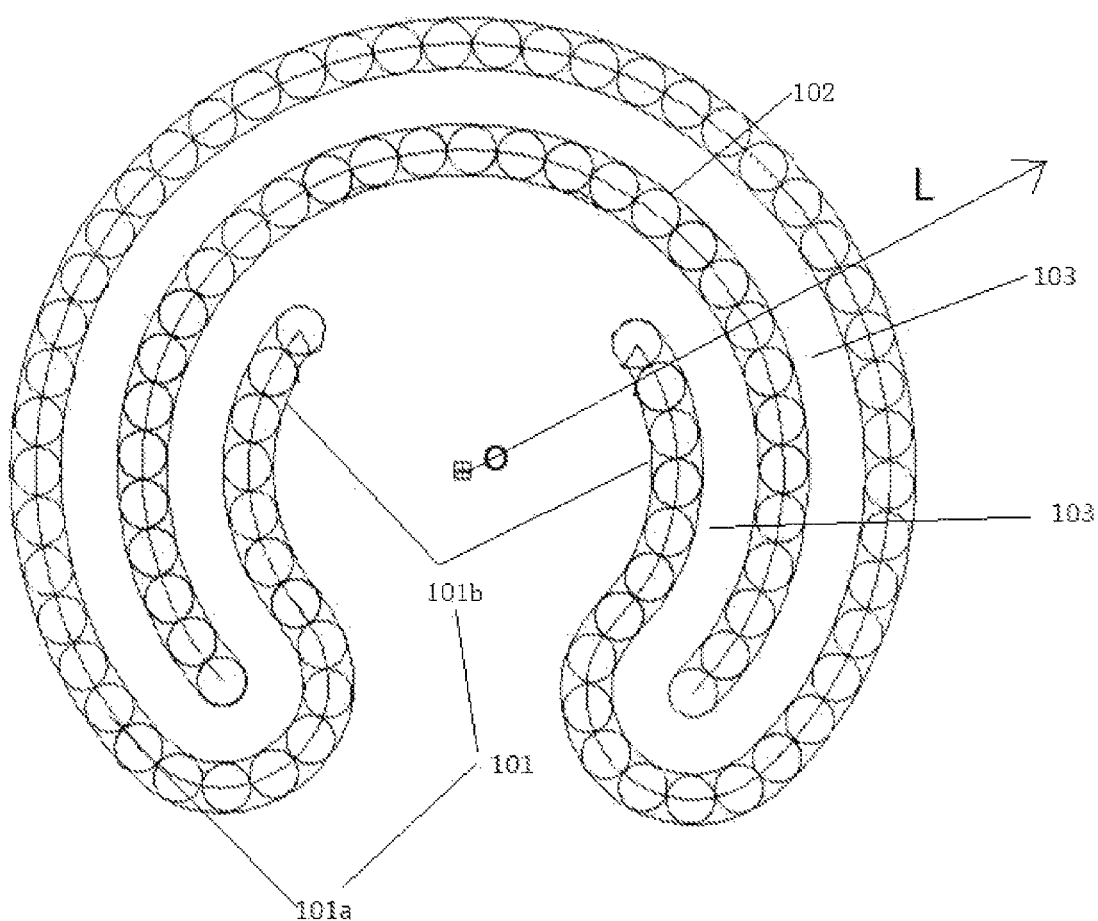
FIG. 4A illustrates a schematic view of a first structure of a magnetron provided by the embodiments of the present disclosure.

In the following, several structures of the magnetron provided by the embodiments of the present disclosure will be described in detail. Specifically, a first type of magnetron may have a structure as shown in FIG. 4A. The first outer magnetic pole 101 of the magnetron may include a first sub-magnetic pole 101*a* having an arc shape, and two second sub-magnetic poles 101*b* with each having an arc shape. In the structure, the two ends of the first sub-magnetic pole 101*a* may be respectively connected to one end of each of the two second sub-magnetic poles 101*b* the two, and the other end of each of the two second sub-magnetic poles 101*b* may extend toward the center of the first sub-magnetic pole 101*a*. The two second sub-magnetic poles 101*b* may be located on a same circle, and the other ends of the two second sub-magnetic poles 101*b* may not be connected. The joint position of the second sub-magnetic pole 101*b* and the first sub-magnetic pole 101*a* can be transitioned by a smooth curve. Moreover, the first inner magnetic pole 102 may be located on the inner side of the first outer magnetic pole 101 and may have an arc shape; the centers of the first sub-magnetic pole 101*a*, the two second sub-magnetic poles 101*b*, and the first inner magnetic pole 102 may coincide with the rotation center O. Of course, in practical applications, the centers of the first sub-magnetic pole 101*a*, the two second sub-magnetic poles 101*b*, and the first inner magnetic pole 102 may not be the rotation center O, and as long as the rotation center O is located inside the first inner magnetic pole 102, uniformity can also be achieved for magnetic thin films.

The first outer magnetic pole 101 described above is an unclosed magnetic pole formed by the first sub-magnetic pole 101*a* and the two second sub-magnetic poles 101*b*. This magnetron can be applied to a case where the sputtering power source is a radio frequency (RF) power source.

Figure 4B:
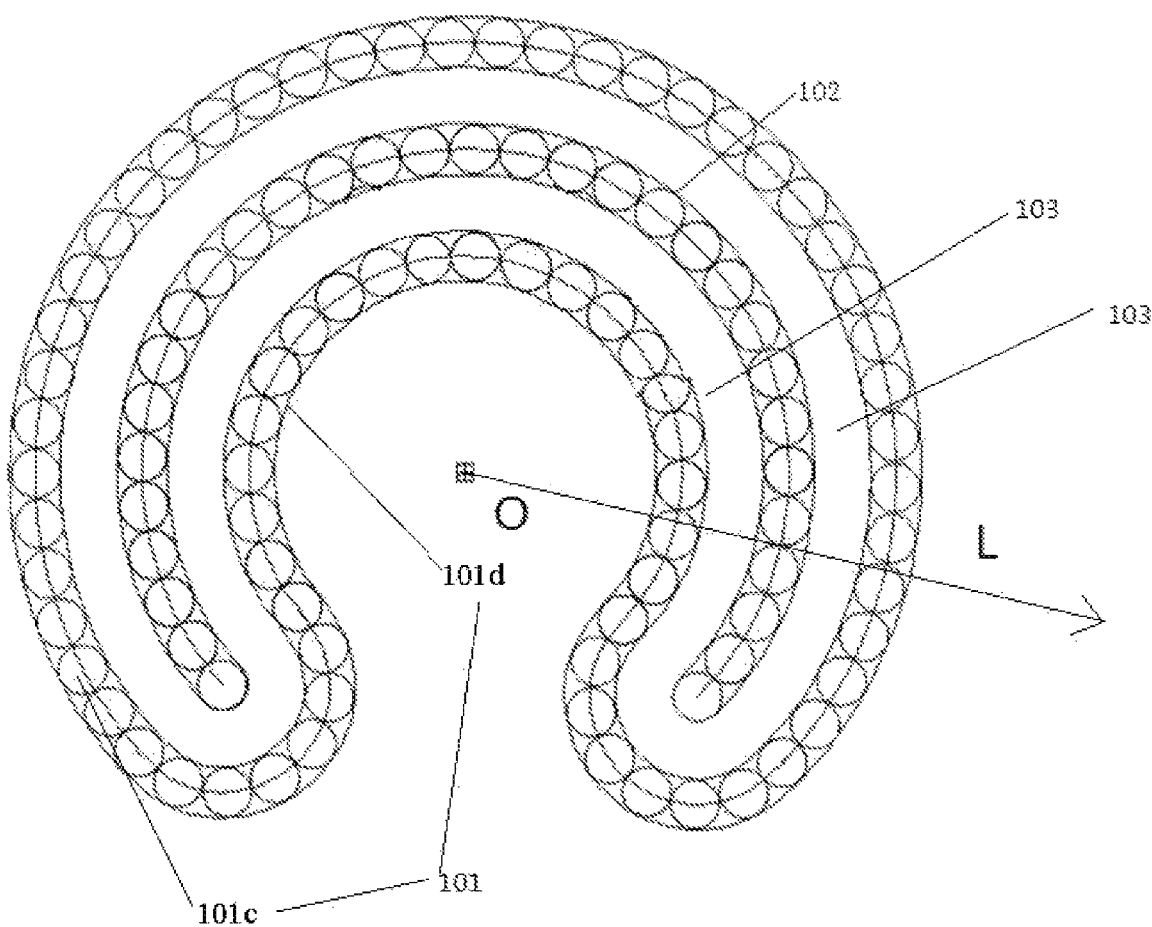
FIG. 4B illustrates a schematic view of a second structure of a magnetron provided by the embodiments of the present disclosure.

A second type of magnetron may have a structure as shown in FIG. 4B. The first outer magnetic pole 101 may include a third sub-magnetic pole 101*c* having an arc shape and a fourth sub-magnetic pole 101*d* having an arc shape. The fourth sub-magnetic pole 101*d* may be located on the inner side of the third sub-magnetic pole 101*c*, and the centers of both may coincide with the rotation center O. Moreover, the two ends of the fourth sub-magnetic pole 101*d* may be respectively connected to the two ends of the third sub-magnetic pole 101*c*. The first inner magnetic pole 102 may have an arc shape, and the center of the first inner magnetic pole 102 may coincide with the rotation center O. Of course, in practical applications, the centers of the third sub-magnetic pole 101*c* and the fourth sub-magnetic pole 101*d* may not be the rotation center O, and as long as the rotation center O is located inside the first inner magnetic pole 102, uniformity can also be achieved for magnetic thin films.

As can be seen from the above, the first outer magnetic pole 101 is a closed magnetic pole formed by the third sub-magnetic pole 101*c* and the fourth sub-magnetic pole 101*d*. This magnetron can be applied to a case where the sputtering power source is a DC power source.

It should be noted that the present disclosure is not limited to the shapes of the first outer magnetic pole 101 and the first inner magnetic pole 102 shown in FIGS. 4A and 4B. In practical applications, the first outer magnetic pole 101 and the first inner magnetic pole 102 may also adopt any other shapes as long as the straight line L starting from the rotation center O and along one of the radial directions passes through the first magnetic field track 103 twice in succession, and the magnetic-field directions at the two positions of the first magnetic field track that the straight line L passes through twice in succession are opposite to each other, the object of the present disclosure may be achieved.

Figure 5A:
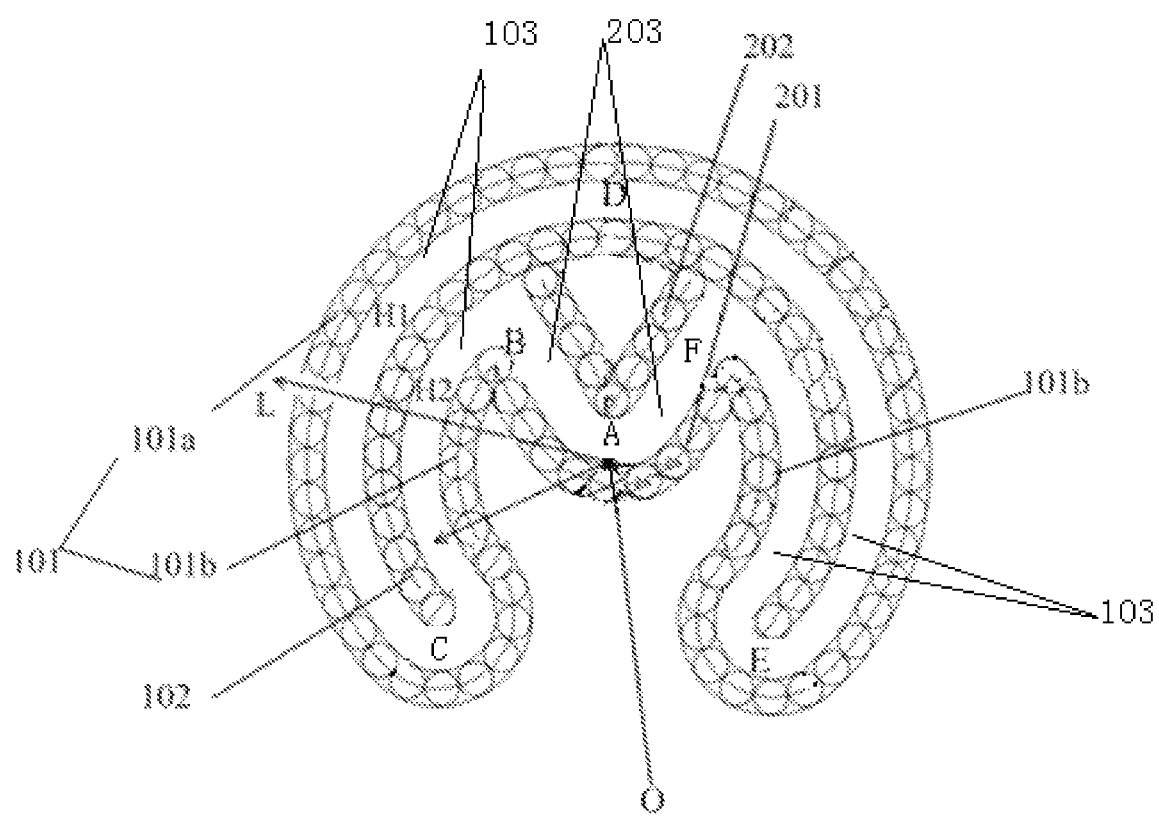
FIG. 5A illustrates a schematic view of a third structure of a magnetron provided by the embodiments of the present disclosure.

In order to achieve full target scanning of the target, the magnetron may further include a second outer magnetic pole and a second inner magnetic pole of opposite polarities, and a second magnetic field track 203 formed therebetween, such as the track B-A-F shown in FIG. 5A. Moreover, the rotation center O may be located inside the second magnetic field track 203; the first magnetic field track 103 may be disposed around the second magnetic field track 203 for scanning the edge portion of the target, and the second magnetic field track 203 may be used for scanning the central portion of the target. In this way, when the magnetron rotates around the rotation center O, the scanning range can be increased by the rotation center O and the surrounding region thereof, thereby avoiding the presence of the scanning blind zone and realizing the full target scanning of the target. As such, the uniformity of the magnetic thin film can be further improved, and the utilization of the target may also be improved.

In the following, the structure of the magnetron having the second outer magnetic pole and the second inner magnetic pole will be described in detail. The magnetrons shown in FIG. 5A to FIG. 5D are all based on the magnetron shown in FIG. 4A with improvement. Specifically, a first type of magnetron may have a structure as shown in FIG. 5A. The first outer magnetic pole 101 may include a first sub-magnetic pole 101a having an arc shape, and two second sub-magnetic poles 101b with each having an arc shape. In the structure, the two ends of the first sub-magnetic pole 101a may be respectively connected to one end of each of the two second sub-magnetic poles 101b, and the other end of each of the two second sub-magnetic poles 101b may extend toward the center of the first sub-magnetic pole 101a. The two second sub-magnetic poles 101b may be located on a same circle, and the other ends of the two second sub-magnetic poles 101b may not be connected. The joint position of the second sub-magnetic pole 101b and the first sub-magnetic pole 101a can be transitioned by a smooth curve. Moreover, the first inner magnetic pole 102 may be located on the inner side of the first outer magnetic pole 101 and may have an arc shape; the centers of the first sub-magnetic pole 101a, the two second sub-magnetic poles 101b, and the first inner magnetic pole 102 may coincide with the rotation center O.

The second outer magnetic pole 201 may have an arc shape, and the two ends of the second outer magnetic pole 201 may be respectively connected to the other ends of the two second sub-magnetic poles 101b. The joint positions may be located at one side of the rotation center O, and a portion of the second outer magnetic pole 201 close to the middle may be located on the other side of the rotation center O. That is, the second outer magnetic pole 201 may form a structure that is concave toward the rotation center O. Further, the second inner magnetic pole 202 may be disposed between the first inner magnetic pole 102 and the second outer magnetic pole 201, and the second inner magnetic pole 202 may be connected to the first inner magnetic pole 102.

Since the magnetic poles of the second outer magnetic pole 201 and the second sub-magnetic pole 101b have the same polarity, the two ends of the second outer magnetic pole 201 may be respectively connected to the other ends of the two second sub-magnetic poles 101b, which is conducive to processing. For example, the second outer magnetic pole 201 and the second sub-magnetic pole 101b may be simultaneously formed through integral molding. Similarly, since the magnetic poles of the second inner magnetic pole 202 and the first inner magnetic pole 102 have the same polarity, by connecting the second inner magnetic pole 202 to the first inner magnetic pole 102, processing may be facilitated.

Figure 5B:
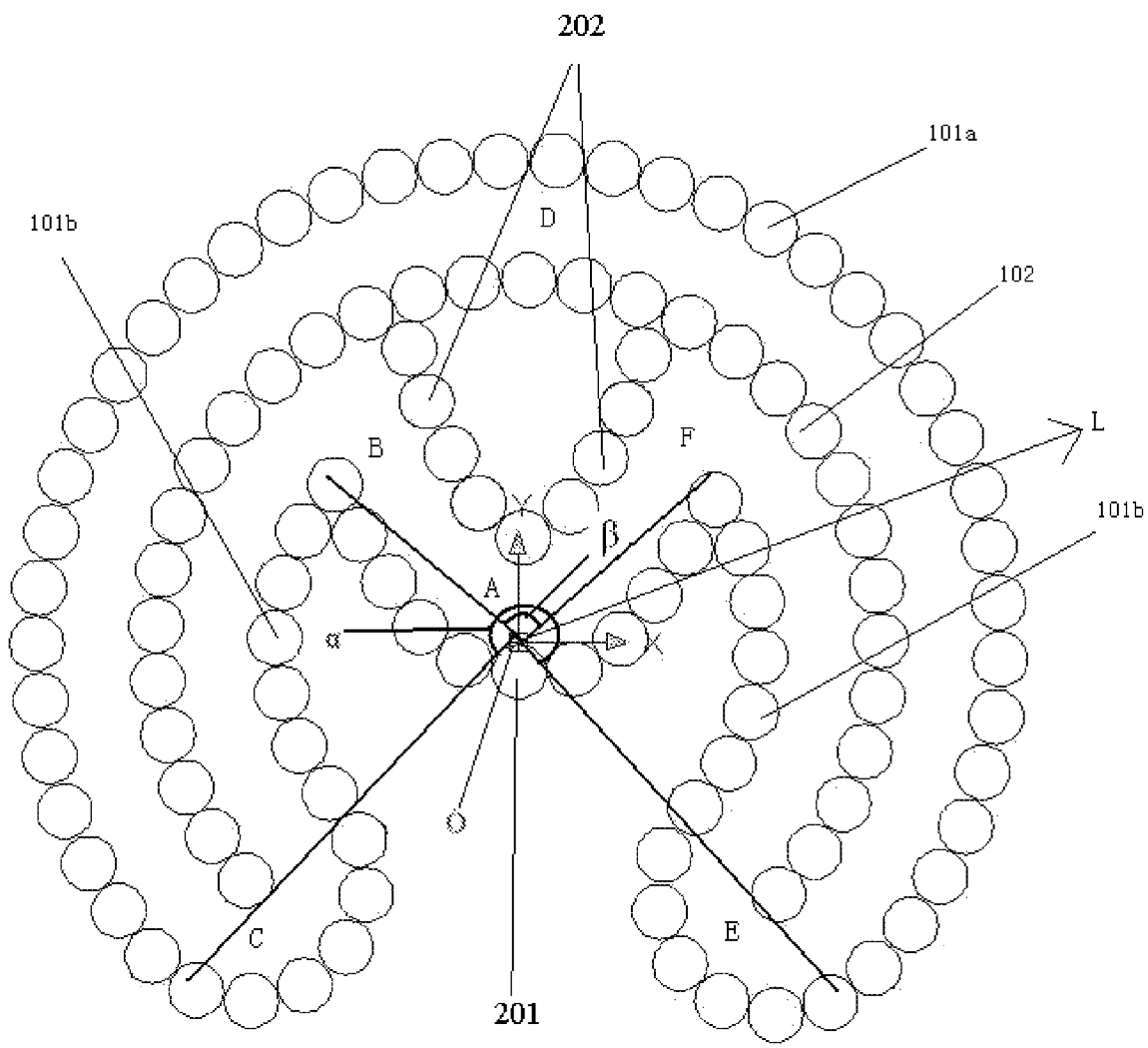
FIG. 5B illustrates a schematic view of a fourth structure of a magnetron provided by the embodiments of the present disclosure.
Figure 5C:
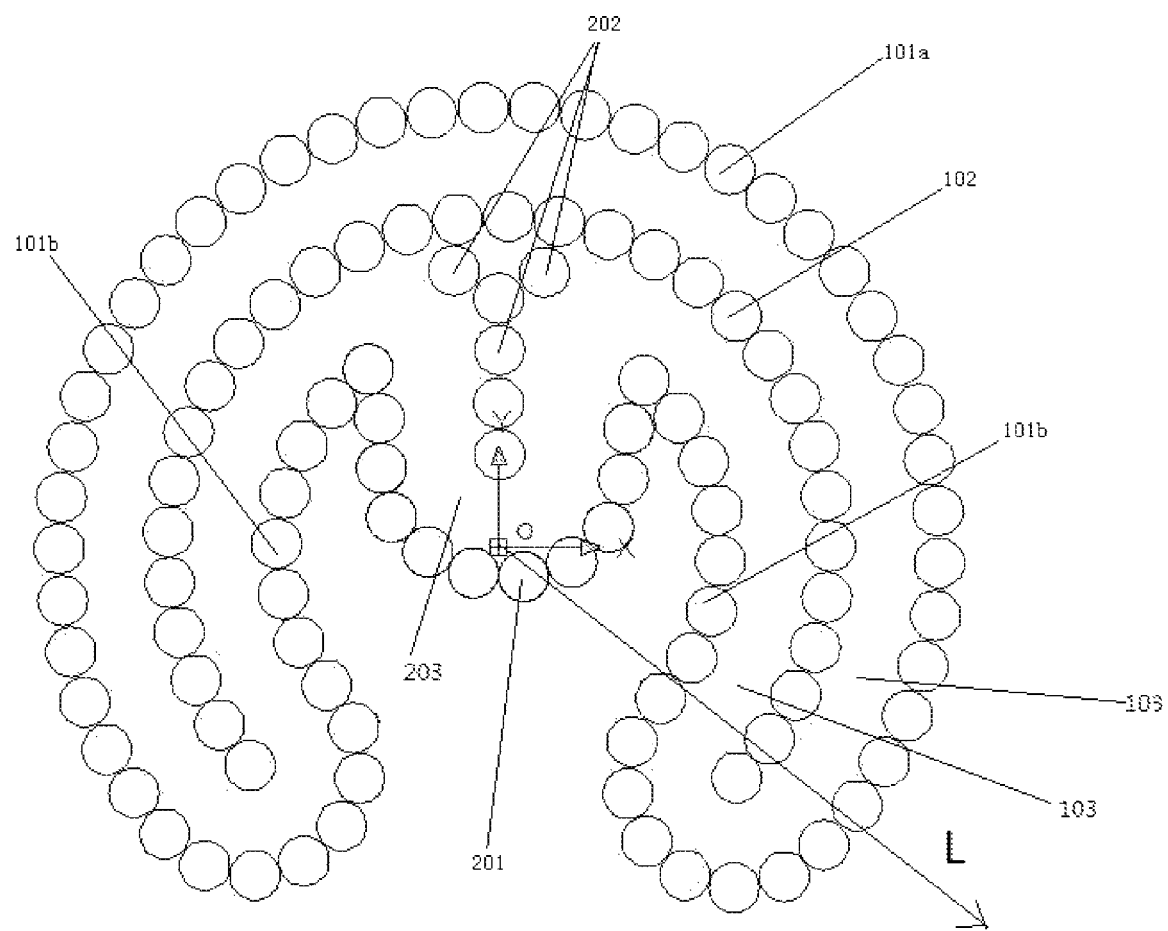
FIG. 5C illustrates a schematic view of a fifth structure of a magnetron provided by the embodiments of the present disclosure.

The shape of the second inner magnetic pole 202 includes, but is not limited to, a V shape (as shown in FIG. 5A), a U shape (as shown in FIG. 5B), or a Y shape (as shown in FIG. 5C). The opening of the V shape or the U shaped may face away from the rotation center O.

The above magnetron is more suitable for depositing magnetic thin films on large size workpieces to be processed (for example, 8-inch or 12-inch wafers) because when the size of the workpiece to be processed is large, it is necessary to adaptively increase the target. Because the magnetic-field decay of the bias magnetic field is quick, the influence on the edge portion of the workpiece to be processed may be significant, while the influence on the central portion may be small. Therefore, by providing a first magnetic field track 103 to correspond to the edge portion of the workpiece to be processed, the uniformity of the magnetic thin film deposited on the edge portion of the workpiece to be processed may be improved. In the meantime, by providing a second magnetic field track 203 to correspond to the center portion of the workpiece to be processed, the full target scanning of the target can be realized, thereby avoiding the presence of the scanning blind zone. As such, the sputtering uniformity of the magnetic thin film may be improved.

Optionally, the first magnetic field track 103 may have a same width in the direction of the straight line L starting from the rotation center O and along one of the radial directions. That is, as shown in FIG. 3, the width of the gap H1 may be equal to the width of the gap H2. In this way, the amount of the sputtered magnetic materials corresponding to the gap H1 can be made substantially the same as that corresponding to the gap H2, such that the amount of the magnetic material subjected to the attractive force may be substantially the same as that subjected to the repulsive force. Therefore, the amount of the magnetic material shifted toward the edge of the workpiece to be processed and the amount of the magnetic material shifted toward the center of the workpiece to be processed may be substantially the same. As such, the uniformity of the magnetic thin film may be improved.

The width of the first magnetic field track 103 in the direction of the straight line L may be in a preferable range of 10 to 60 mm, and more preferably, 15 mm to 35 mm. The range of the width is determined based on the decay speed of the magnetic field so that the pairs of the magnetic field tracks that are capable of generating attractive forces and repulsive forces on the magnetic material can be set as many as possible. As such, the uniformity of the magnetic thin film can be effectively improved.

Optionally, as shown in FIG. 5B, the central angle of the arc of the first sub-magnetic pole 101a may be angle $\alpha$; the angle between the two lines that respectively connect the other ends of the two second sub-magnetic poles 101b to the rotation center O may be angle $\beta$; in addition, the ratio of angle $\alpha$ to angle $\beta$ may be preferably greater than 3.5. In this way, the distribution of the first magnetic field track 103 in the circumferential direction can be controlled within a certain proportional range, such that the uniformity of the magnetic thin film at the edge portion can be effectively improved when processing a large size workpiece to be processed.

Figure 5D:
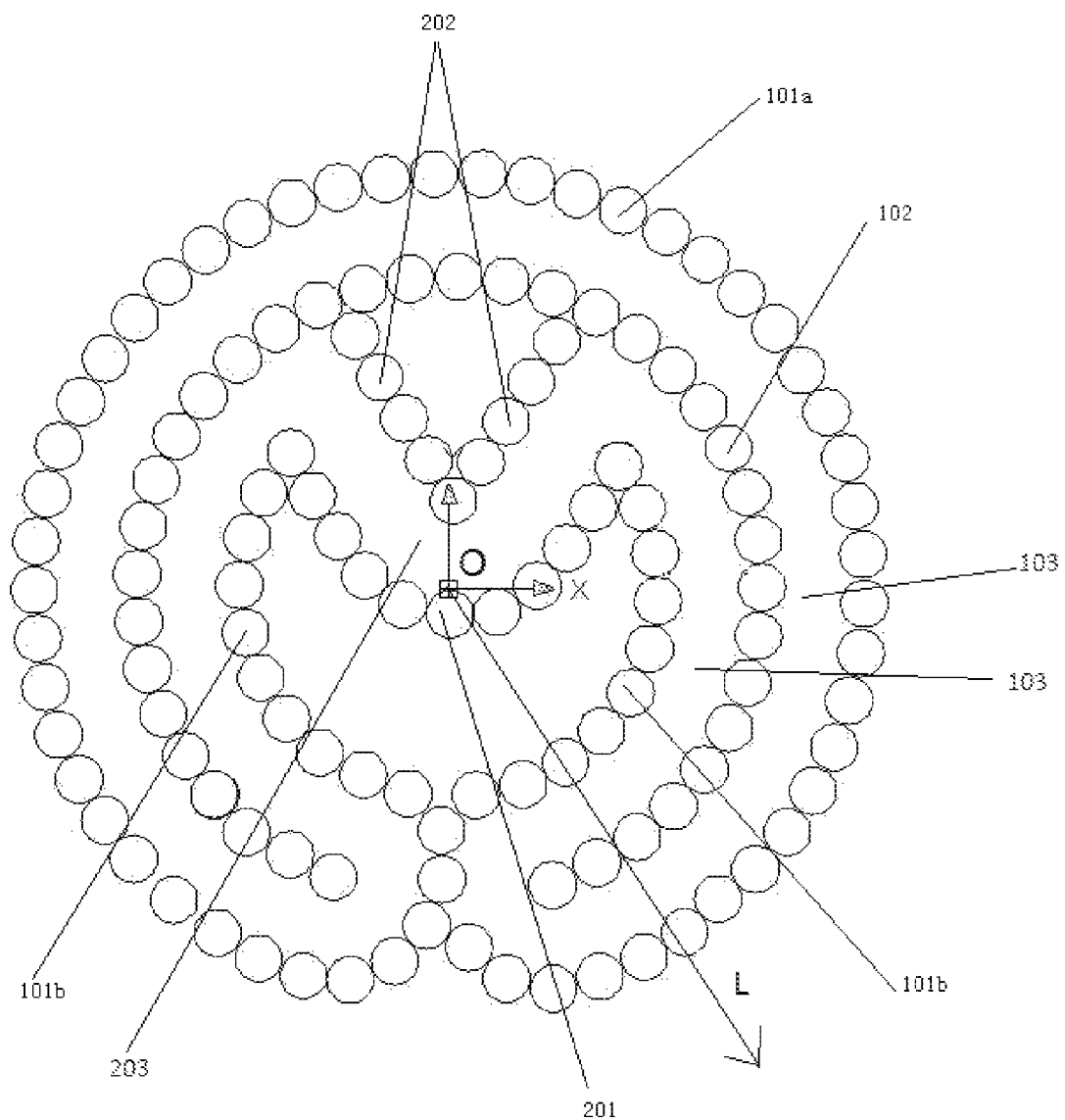
FIG. 5D illustrates a schematic view of a sixth structure of a magnetron provided by the embodiments of the present disclosure.

Further, optionally, as shown in FIG. 5D, the above-mentioned angle $\alpha$ may be close to 360 degrees, and the uniformity of the magnetic thin film deposited on the workpiece to be processed may be further improved.

It should be noted that, in the magnetron shown in FIG. 5A to FIG. 5D, the two ends of the second outer magnetic pole 201 may be respectively connected with the two ends of the first outer magnetic pole 101 to form a closed outer magnetic pole. However, the present disclosure is not limited thereto, and in practical applications, the two may be independent of each other.

Figure 5E:
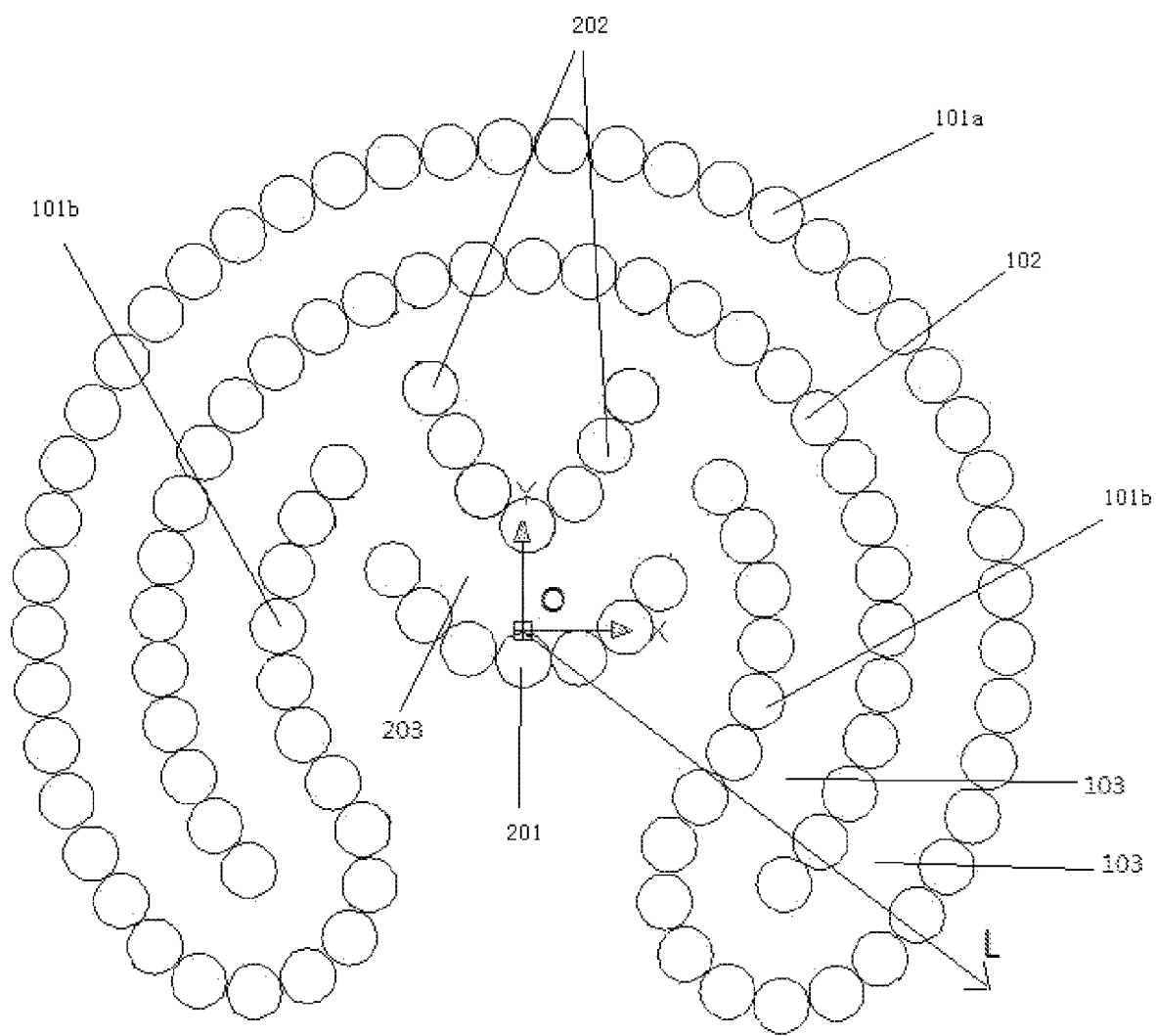
FIG. 5E illustrates a schematic view of a seventh structure of a magnetron provided by the embodiments of the present disclosure.
Figure 5F:
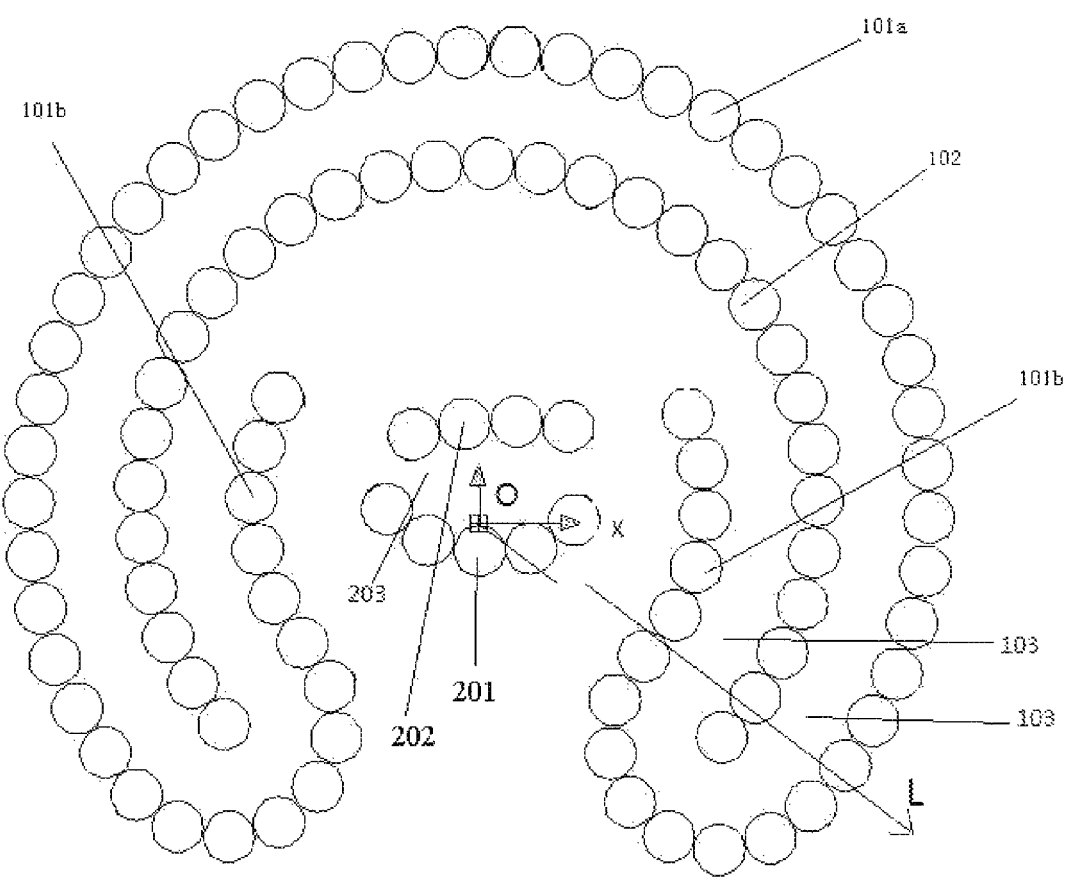
FIG. 5F illustrates a schematic view of an eighth structure of a magnetron provided by the embodiments of the present disclosure.

A second type of magnetron may have a structure as shown in FIG. 5E and FIG. 5F, which is different from the structure of the first type of magnetron (referring to FIG. 5A to FIG. 5D) in that: on the basis of the magnetron shown in FIG. 4A, the second outer magnetic pole 201 may not be connected to the first outer magnetic pole 101; the second inner magnetic pole 202 may not be connected to the first inner magnetic pole 102. Moreover, a second magnetic field track 203 may be formed between the second outer magnetic pole 201 and the second inner magnetic pole 202, and the rotation center O may be located inside the second magnetic field track 203.

As such, the second outer magnetic pole 201 and the first outer magnetic pole 101 may be independent of each other, so that the magnetic properties of the two may not be related; the second inner magnetic pole 202 and the first inner magnetic pole 102 may be independent of each other, so that the magnetic properties of the two may not be related. As such, it is only necessary to ensure that the polarities of the second inner magnetic pole 202 and the second outer magnetic pole 201 are opposite.

In practical applications, the second outer magnetic pole 201 and the second inner magnetic pole 202 may be curved, straight, or any other shape, as long as the rotation center O can be enclosed in the second magnetic field track 203.

The second type of magnetron shown in FIG. 5E and FIG. 5F can uniformly sputter the magnetic thin film at the edge portion of the workpiece to be processed, and at the same time, can achieve full target scanning. In addition, the second type of magnetron shown in FIG. 5E and FIG. 5F can be applied to a case where the sputtering power source is an RF power source.

The uniformity of the magnetic thin films obtained by the sputtering process using magnetrons of the above-mentioned various structures provided by the embodiments of the present disclosure may be smaller than or equal to 5%, and may even reach 3%, demonstrating desired thin-film uniformity.

In summary, the magnetron provided by the embodiments of the present disclosure is able to compensate for the difference in the amount of magnetic materials deposited to the edge region and the central region of the workpiece to be processed, and thus may improve the uniformity of the thin film. Further, when the magnetron of the present disclosure is used for sputtering deposition of a non-magnetic thin film, thin films with desired uniformity may also be obtained.

As another technical solution, the present disclosure further provides a magnetron sputtering chamber, used to deposit magnetic thin films and including: the above-mentioned magnetron provided by the embodiments of the present disclosure. The magnetron may rotate around a rotation center, and may be used to scan the surface of the target. Moreover, a bias magnetic field device for forming a horizontal magnetic field may also be disposed in the magnetron sputtering chamber.

By providing the above-mentioned bias magnetic field device, a horizontal magnetic field (the strength of the magnetic field can reach 50 to 300 Gs) can be formed above a carrier device 4, so that the magnetic domains of the magnetic material deposited on the surface of the workpiece S to be processed may be arranged in the horizontal direction. Therefore, an easy magnetization axis may be obtained in direction in which the magnetic domains are aligned, and a hard magnetization axis may be obtained in a direction perpendicular to the direction in which the magnetic domains are aligned. That is, in-plane anisotropy may be formed. As such, a magnetic thin film with in-plane anisotropy may be obtained, and thus the bias magnetic field device is applicable to large size to-be-processed workpieces (for example, 8-inch or 12-inch wafers).

Figure 6:
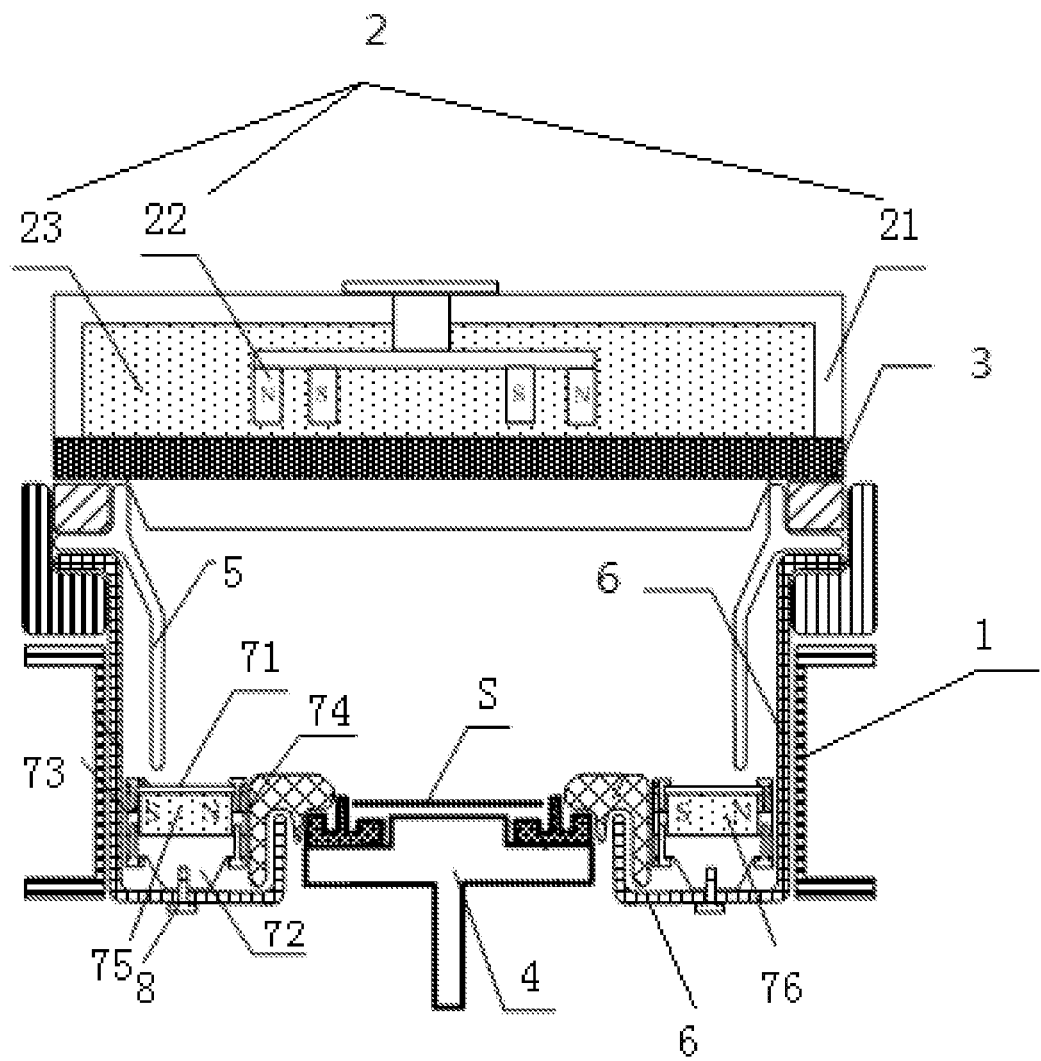
FIG. 6 illustrates a schematic view of a structure of a magnetic sputtering chamber provided by the embodiments of the present disclosure.

In the following, a specific embodiment of the magnetron sputtering chamber provided by the present disclosure is described in detail. Specifically, referring to FIG. 6, the magnetron sputtering chamber may include a chamber 1, a magnetron assembly 2, a target 3, a carrier device 4, an upper shield 5, a lower shield 6, and a bias magnetic field device. The target 3 may be disposed at the top of the chamber 1; the carrier device 4 may be configured to carry the workpiece S to be processed, which is disposed at the bottom of the chamber 1 opposite to the target 3; the upper shield 5 may be fixed to the top of the sidewall of the chamber 1, and may be disposed around the inner side of the sidewall of the chamber 1; the lower shield 6 may be fixed on the top of the sidewall of the chamber 1 and may be located on the outer side of the upper shield 5. The lower shield 6 may be formed with a trench surrounding the carrier device 4 and located between the carrier device 4 and the sidewall of the chamber 1. The upper shield 5 and the lower shield 6 may be used to protect the sidewall of the chamber 1 and the portion below the carrier device 4 from being plasma corroded.

The magnetron assembly 2 may be disposed above the target 3, and may include a holder 21 made of an insulating material, and a magnetron 22. The holder 21 may have a shell structure with an opening, and the end that has the opening may be fixed on the target 3; the magnetron 22 may be disposed in the holder 21 and fixed on the top of the holder 21, and deionized water 23 may be filled inside the holder 21 for cooling the target 3; the magnetron 22 may be used to scan the surface of the target 3, and the magnetron 22 may rotate around the rotation center. The rotation center may correspond to the center of the target 3.

The bias magnetic field device may be fixed in the trench of the lower shield 6 by screws 8, and the bias magnetic field device may include: a first magnetic group and a second magnetic group. The first magnetic group may include a plurality of first magnetic cylinders 75 and the second magnetic group may include a plurality of second magnetic cylinders 76. The plurality of first magnetic cylinders 75 may be arranged in an arc shape around the carrier device 4, and the plurality of second magnetic cylinders 76 may be arranged in an arc shape around the carrier device 4. Moreover, the plurality of first magnetic cylinder 75 and the plurality of second magnetic cylinders 76 may be symmetrically disposed. In addition, the magnetic poles of the first magnetic cylinder 75 and the second magnetic cylinder 76 that point to the carrier device 4 may be different. Specifically, the magnetic pole of the first magnetic cylinder 75 that points to the carrier device 4 may be the N pole, and the magnetic pole of the second magnetic cylinder 76 that points to the carrier device 4 may be the S pole.

By using the above-mentioned magnetron provided by the embodiments of the present disclosure, the magnetron sputtering chamber provided by the embodiments of the present disclosure may be able to avoid the problem of undesired uniformity of the thin film formed on the workpiece to be processed due to the presence of the bias magnetic field, and thus may be able to improve the uniformity of the thin film.

As another technical solution, the embodiments of the present disclosure further provide a magnetron sputtering apparatus including the above-mentioned magnetron sputtering chamber provided by the embodiments of the present disclosure.

By using the above-mentioned magnetron sputtering chamber provided by the embodiments of the present disclosure, the magnetron sputtering apparatus provided by the embodiments of the present disclosure may be able to avoid the problem of undesired uniformity of the thin film formed on the workpiece to be processed due to the presence of the bias magnetic field, and thus may be able to improve the uniformity of the thin film.

Compared to existing magnetron, magnetron sputtering chamber, and magnetron sputtering apparatus, the disclosed magnetron, magnetron sputtering chamber, and magnetron sputtering apparatus demonstrate the following exemplary advantages.

According to the disclosed magnetron, a first magnetic field track is formed between a first inner magnetic pole and a first outer magnetic pole. Moreover, a straight line starting from the rotation center of the magnetron and along one of the radial directions passes through the first magnetic field track at least twice in succession, and the magnetic-field directions at the two positions of the first magnetic field track that the straight line passes through twice in succession are opposite to each other. Compared to the existing technology, the disclosed magnetron may be able to improve the uniformity of the thin film.

In particular, in the case of fabricating a soft magnetic thin film using a magnetron sputtering apparatus that adopts a bias magnetic field, by adopting the above-mentioned magnetron provided by the present disclosure, the magnetic domain directions of the sputtered magnetic materials respectively corresponding to the two positions of the first magnetic track that the straight line passes through twice in succession can be made different. Therefore, the magnetic materials sputtered from the target and respectively corresponding to the two positions of the first magnetic field track that the straight line passes through twice in succession are subjected to a repulsive force and an attractive force of the bias magnetic field, respectively. The magnetic material subjected to the attraction force of the bias magnetic field moves toward the edge direction of the workpiece to be processed, and the magnetic material subjected to the repulsive force of the bias magnetic field moves toward the center direction of the workpiece to be processed. As such, the difference in the amount of magnetic materials deposited to the edge region and the central region of the workpiece to be processed may be compensated, thereby improving the uniformity of the thin film.

The magnetron sputtering chamber provided by the present disclosure, by adopting the magnetron provided by the present disclosure, can improve the uniformity of the thin film.

The magnetic sputtering apparatus provided by the present disclosure, by adopting the above-mentioned magnetic sputtering chamber, can improve the uniformity of the thin film.

It should be understood that the embodiments described above are merely exemplary embodiments employed to explain the principles of the invention, but the invention is not limited thereto. Various modifications and improvements can be made by those skilled in the art without departing from the spirit and scope of the invention, and such modifications and improvements are also considered to be within the scope of the invention.

What is claimed is:

1. A magnetron having a rotation center and comprising a first outer magnetic pole and a first inner magnetic pole of opposite polarities, wherein:
   the first outer magnetic pole includes a first sub-magnetic pole having an arc, two second sub-magnetic poles with each having an arc, and two third sub-magnetic poles with each having an arc, wherein:
   two ends of the first sub-magnetic pole are respectively connected to one end of each of the two third sub-magnetic poles, another end of each of the two third sub-magnetic poles is connected to one end of each of the two second sub-magnetic poles, and
   centers of the first sub-magnetic pole and the two second sub-magnetic poles coincide with the rotation center;
   the first inner magnetic pole is located on an inner side of the first outer magnetic pole, and the first inner magnetic pole includes an integral circular arc;
   a first magnetic field track is formed between the first inner magnetic pole and the first outer magnetic pole; and
   a straight line starting from the rotation center and along one of radial directions passes through the first magnetic field track at least twice in succession, and magnetic-field directions at two positions of the first magnetic field track that the straight line passes through twice in succession are opposite to each other.

2. The magnetron according to claim 1, further including a second outer magnetic pole and a second inner magnetic pole of opposite polarities, wherein:
   a second magnetic field track is formed between the second outer magnetic pole and the second inner magnetic pole with the rotation center located inside the second magnetic field track; and
   the first magnetic field track is disposed around the second magnetic field track.

3. The magnetron according to claim 2, wherein:
   the two second sub magnetic poles extends toward a center of the first sub magnetic pole, the two second sub-magnetic poles are located on a same circle, and other ends of the two second sub-magnetic poles are separated from each other; and
   a center of the first inner magnetic pole coincides with the rotation center.

4. The magnetron according to claim 3, wherein:
   the second outer magnetic pole has an arc shape, and two ends of the second outer magnetic pole are respectively connected to the other ends of the two second sub-magnetic poles with joint positions located at one side of the rotation center, a middle portion of the second outer magnetic pole being arranged on the other side of the rotation center; and
   the second inner magnetic pole is disposed between the first inner magnetic pole and the second outer magnetic pole.

5. The magnetron according to claim 4, wherein:
   the second inner magnetic pole is connected to the first inner magnetic pole.

6. The magnetron according to claim 3, wherein:
   the second outer magnetic pole and the first outer magnetic pole are separated from each other; and
   the second inner magnetic pole and the first inner magnetic pole are separated from each other.

7. The magnetron according to claim 4, wherein:
   a shape of the second inner magnetic pole includes: a V shape, a U shape, or a Y shape, wherein:
      an opening of the V shape or the U shape faces away from the rotation center.

8. The magnetron according to claim 3, wherein:
   a central angle of the first sub-magnetic pole is angle $\alpha$; and
   an angle between two lines that respectively connect the other ends of the two second sub-magnetic poles to the rotation center is angle $\beta$, wherein:
      a ratio of angle $\alpha$ to angle $\beta$ is greater than 3.5.

9. The magnetron according to claim 1, wherein:
a center of the first inner magnetic pole coincides with the rotation center.

10. The magnetron according to claim 1, wherein:
a number of times that the straight line passes through the first magnetic field track is an even number.

11. The magnetron according to claim 1, wherein:
the first magnetic field track has a same width in a direction of the straight line.

12. The magnetron according to claim 11, wherein:
a width of the first magnetic field track is in a range of approximately 10 mm to 60 mm.

13. The magnetron according to claim 12, wherein:
the width of the first magnetic field track is in a range of approximately 15 mm to 35 mm.

14. The magnetron according to claim 2, wherein:
a width of the second magnetic field track is in a range of approximately 10 mm to 60 mm.

15. A magnetron sputtering chamber, configured to deposit magnetic thin films, and comprising a magnetron, wherein:
the magnetron has a rotation center and includes a first outer magnetic pole and a first inner magnetic pole of opposite polarities, wherein:
the first outer magnetic pole includes a first sub-magnetic pole having an arc, two second sub-magnetic poles with each having an arc, and two third sub-magnetic poles with each having an arc, wherein:
two ends of the first sub-magnetic pole are respectively connected to one end of each of the two third sub-magnetic poles, another end of each of the two third sub-magnetic poles is connected to one end of each of the two second sub-magnetic poles, and
centers of the first sub-magnetic pole and the two second sub-magnetic poles coincide with the rotation center,
the first inner magnetic pole is located on an inner side of the first outer magnetic pole, and the first inner magnetic pole includes an integral circular arc,
a first magnetic field track is formed between the first inner magnetic pole and the first outer magnetic pole, and
a straight line starting from the rotation center and along one of radial directions passes through the first magnetic field track at least twice in succession, and magnetic-field directions at two positions of the first magnetic field track that the straight line passes through twice in succession are opposite to each other;
the magnetron rotates around the rotation center to scan a surface of a target; and
a bias magnetic field device for forming a horizontal magnetic field is disposed in the magnetron sputtering chamber.

16. The magnetron sputtering chamber according to claim 15, wherein:
the magnetron further includes a second outer magnetic pole and a second inner magnetic pole of opposite polarities, wherein:
a second magnetic field track is formed between the second outer magnetic pole and the second inner magnetic pole with the rotation center located inside the second magnetic field track; and
the first magnetic field track is disposed around the second magnetic field track.

17. The magnetron sputtering chamber according to claim 16, wherein:
the two second sub-magnetic poles are located on a same circle, and other ends of the two second sub-magnetic poles are separated from each other; and
a center of the first inner magnetic pole coincides with the rotation center.

18. The magnetron sputtering chamber according to claim 17, wherein:
the second outer magnetic pole has an arc shape, and two ends of the second outer magnetic pole are respectively connected to the other ends of the two second sub-magnetic poles with joint positions located at one side of the rotation center, a middle portion of the second outer magnetic pole being arranged on the other side of the rotation center; and
the second inner magnetic pole is disposed between the first inner magnetic pole and the second outer magnetic pole.

19. The magnetron sputtering chamber according to claim 17, wherein:
a central angle of the first sub-magnetic pole is angle α; and
an angle between two lines that respectively connect the other ends of the two second sub-magnetic poles to the rotation center is angle β, wherein:
a ratio of angle α to angle β is greater than 3.5.

20. A magnetron sputtering apparatus, comprising the magnetic sputtering chamber according to claim 15.

* * * * *